United States Patent [19]
Guckel et al.

[11] Patent Number: 5,718,618
[45] Date of Patent: Feb. 17, 1998

[54] LAPPING AND POLISHING METHOD AND APPARATUS FOR PLANARIZING PHOTORESIST AND METAL MICROSTRUCTURE LAYERS

[75] Inventors: Henry Guckel; Pawitterjit S. Mangat, both of Madison, Wis.

[73] Assignee: Wisconsin Alumni Research Foundation, Madison, Wis.

[21] Appl. No.: 598,851

[22] Filed: Feb. 9, 1996

[51] Int. Cl.$^6$ .................................................. B24B 53/00
[52] U.S. Cl. .................. 451/41; 451/56; 451/285; 451/287; 451/443; 156/636.1; 437/228
[58] Field of Search .................................. 457/36, 37, 41, 457/56, 58, 285, 287, 288, 289, 444, 446; 156/636.1, 645.1; 437/228, 229

[56] References Cited

U.S. PATENT DOCUMENTS

| | | | |
|---|---|---|---|
| 4,879,258 | 11/1989 | Fisher | 451/285 |
| 5,189,777 | 3/1993 | Guckel et al. | |
| 5,190,637 | 3/1993 | Guckel | |
| 5,206,983 | 5/1993 | Guckel et al. | |
| 5,216,843 | 6/1993 | Breivogel et al. | 451/56 |
| 5,327,033 | 7/1994 | Guckel et al. | |
| 5,357,807 | 10/1994 | Guckel et al. | |
| 5,378,583 | 1/1995 | Guckel et al. | |
| 5,496,668 | 3/1996 | Guckel et al. | |
| 5,531,635 | 7/1996 | Mogi et al. | 451/56 |
| 5,547,417 | 8/1996 | Breivogel et al. | 451/56 |

OTHER PUBLICATIONS

Guckel, H., et al., "Fabrication of Assembled Micromechanical Components via Deep X-Ray Lithography," Proceedings of IEEE Micro Electro Mechanical Systems, Jan. 30–Feb. 2, 1991, pp. 74–79.

Hagmann and W. Ehrfeld, "Fabrication of Microstructures of Extreme Structural Heights by Reaction Injection Molding," International Polymer Processing IV, vol. 3, 1989, pp. 188–195.

Guckel, H., et al., "Deep X–Ray and UV Lithographies for Micromechanics," Technical Digest, Solid State Sensor and Actuator Workshop, Hilton Head, S.C., Jun. 4–7, 1990, pp. 118–122.

Ehrfeld, W., et al., "LIGA Process: Sensor Construction Techniques Via X–Ray Lithography," Technical Digest IEEE Solid–State Sensor and Actuator Workshop, 1988, pp. 1–4.

Guckel, H., et al., "Processing and Design Considerations for High Force Output—Large Throw Electrostatic, Linear Micro Actuators," Actuator 94, Bermen, West Germany, Jun. 15–17, 1994, pp. 1–4.

*Primary Examiner*—Eileen P. Morgan
*Attorney, Agent, or Firm*—Foley & Lardner

[57] ABSTRACT

A method and apparatus for planarizing photoresist and/or metal microstructure layers is provided. Planarization is achieved by removing material from a workpiece by lapping using a diamond containing lapping slurry. A lapping machine is furnished with a lapping plate made of a soft metal material. The lapping plate is furnished with ridges of controlled height using a diamond conditioning ring with a specified grit size. Free diamonds in a liquid slurry are then sprayed onto the plate and embedded therein by a second conditioning ring. After the lapping plate is conditioned, the piece to be lapped is mounted on the lapping plate. A vacuum hold fixture or flat steel or glass mounting plate may be used. During lapping, additional diamond slurry is sprayed onto the lapping plate and driven into the plate by a ceramic conditioning ring. The size of diamonds in the diamond slurry are selected to control the shear forces applied to the surface being lapped and to achieve a desired surface finish. Polishing, using a cloth covered hard metal polishing plate and loose diamond slurry, may be employed after lapping to provide a smooth optical surface finish. The lapping and polishing method and apparatus of the present invention may be used for z-dimension height control, re-planarization, and surface finishing of precise single or multiple level photoresist-metal layers, or of individual preformed photoresist sheets or laminates thereof.

40 Claims, 8 Drawing Sheets

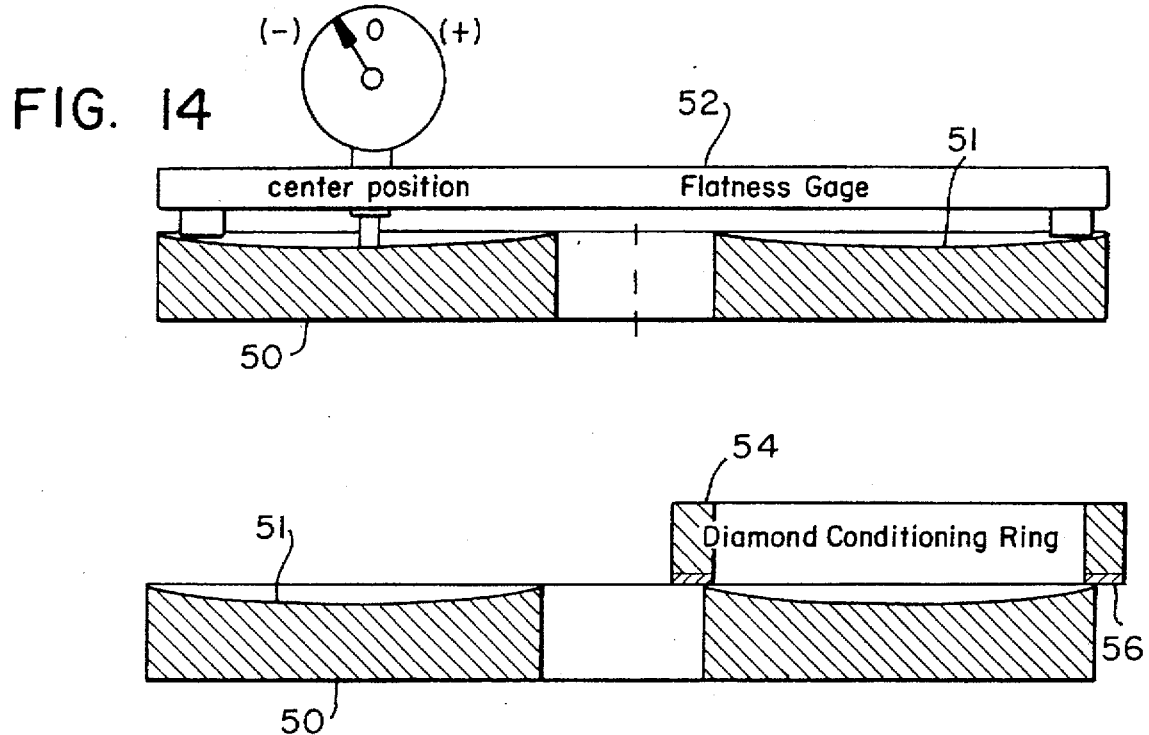
FIG. 14
FIG. 15
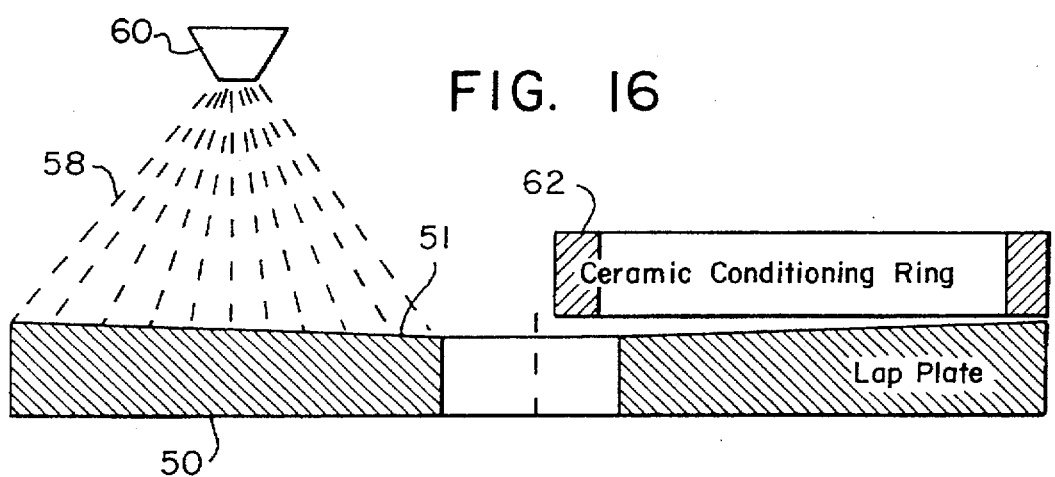
FIG. 16

LAPPING AND POLISHING METHOD AND APPARATUS FOR PLANARIZING PHOTORESIST AND METAL MICROSTRUCTURE LAYERS

This invention was with United States Government support awarded by DOD, ARPA Grant No. N00014-93-1-0911 and Office of the NSF, Grant No. ECS9116566. The United States Government has certain rights in this invention.

FIELD OF THE INVENTION

This invention pertains generally to the field of semiconductor and micromechanical devices and processing techniques therefor, and particularly to methods and devices for removing material from photoresist and metal microstructure layers to planarize and polish the layers for the formation of multi-level and precision engineered microminiature structures.

BACKGROUND OF THE INVENTION

Deep X-ray lithography involves a substrate which is covered by thick photoresist, typically several hundred microns in thickness, which is exposed through a mask by X-rays. X-ray photons are much more energetic than optical photons, which makes complete exposure of thick photoresist films feasible and practical. Furthermore, since X-ray photons are short wavelength particles, diffraction effects which typically limit device dimensions to two or three wavelengths of the exposing radiation are absent for mask dimensions above 0.1 micron. Additionally, X-ray photons are absorbed by atomic processes, therefore, standing wave problems, which typically limit exposure of thick photoresist by optical means, become a non-issue for X-ray exposures. The use of a synchrotron for the X-ray source yields high flux densities of several watts per square centimeter, combined with excellent collimation to produce thick photoresist exposures without any horizontal run-out. Locally exposed patterns will therefore produce vertical photoresist walls if a developing system with very high selectivity between exposed and unexposed photoresist is used. This requirement is satisfied by polymethylmethacrylate (PMMA) as the X-ray photoresist and an aqueous developing system. See: H. Guckel, et al., "Deep X-Ray and UV Lithographies for Micromechanics", Technical Digest, Solid State Sensor and Actuator Workshop, Hilton Head, S.C., Jun. 4–7, 1990, pp. 118–122.

Deep X-Ray lithography may be combined with electroplating to form high aspect ratio structures. This requires that the substrate be furnished with a suitable plating base prior to photoresist application. Typically, this involves a sputtered film of adhesive metal such as chromium or titanium which is followed by a thin film of the metal which is to be plated. The photoresist layer is then applied over the plating base. Exposure through a suitable mask and development are followed by electroplating. This results, after clean-up, in fully attached metal structures with very high aspect ratios. Such structures were reported by W. Ehrfeld and co-workers at the Institute for Nuclear Physics at the University of Karlsruhe in West Germany. Ehrfeld termed the process "LIGA", based on the first letters of the German words for lithography and electroplating. A general review of the LIGA process is given in the article by W. Ehrfeld, et al., "LIGA Process: Sensor Construction Techniques Via X-Ray Lithography", Technical Digest, IEEE Solid State Sensor and Actuator Workshop, 1988, pp. 1–4.

The addition of a sacrificial layer to the LIGA process facilitates the fabrication of fully attached, partially attached, or completely free metal structures. This makes possible the assembly in micromechanics of nearly arbitrary 3-dimensional structures and machines. See H. Guckel, et al., "Fabrication of Assembled Micromechanical Components Via Deep X-Ray Lithography," Proceedings of IEEE Micro Electro Mechanical Systems, Jan. 30-Feb. 2, 1991, pp. 74–79. See also U.S. Pat. Nos. 5,206,983, and 5,327,033, to Guckel, et al., describing micromechanical devices and methods of manufacturing same.

It is possible to extend the LIGA process, with or without a sacrificial layer, by performing several X-Ray exposures of multiple photoresist layers and by electroplating multiple additional layers of metal after each exposure. Such multilevel processing allows complex metal structures to be formed in microminiature dimensions. Structures which may be formed using multilevel processing include structures having overhanging portions, and tubular structures which can be utilized for hydraulic and pneumatic applications. Such structures may be formed on a sacrificial layer, to allow complete removal of the parts from the substrate for subsequent assembly into even more complex structures.

In LIGA processing, a photoresist layer is formed to have recesses which are filled with electroplated metal. However, in electroplating such a layer, the plating rate is dependant on the pattern of the photoresist recesses which are being filled. Uniform deposition of metal is very difficult to achieve, and, therefore, direct height control, i.e., dimensional control in the z-dimension, of the deposited metal is very difficult. However, precise height control is needed for processing precision engineered single and multi-level structures. For example, precise height control is needed to fabricate precision engineered micro-mechanical devices, such as springs, in single level processing. The electroplated metal will also have an uneven surface. Multilevel processing requires re-planarization of the electroplated metal in order to provide a substantially flat, uniform, and smooth surface. Such a surface is better suited to have a second layer electroplated thereon than the rough surface of an as-plated metal. Planarization is also required for proper adhesion of additional photoresist layers. Multilevel processing, and accurate dimensional control in the z (vertical) dimension in processing precision engineered micro parts is, therefore, essentially impossible without replanarization.

One method of re-planarizing an electroplated metal layer involves the machining, e.g., mechanical grinding or milling, of the electroplated metal layer, using commercially available micromilling equipment such as a diamond fly cutter, to achieve a substantially flat and smooth surface. However, such mechanical machining is difficult or impossible where a polymer photoresist remains adjacent to the electroplated metal structure. Machining generally cannot be done through both the photoresist and the metal. The photoresist is relatively weak mechanically, and will shred and tear as it is being milled. Also, the photoresist is not strong enough to provide horizontal support to the relatively small, and potentially fragile, metal microstructure. If the photoresist were removed, and machining of the now isolated metal structure were attempted, such machining would be extremely difficult and would risk substantial damage to the metal structure, such as ripping portions of the metal structure from the substrate.

One solution to this problem was presented in U.S. Pat. No. 5,190,637, to Henry Guckel, entitled Formation of Microstructures by Multiple Level Deep X-Ray Lithography with Sacrificial Metal Layers. In carrying out the process of this invention, a primary metal layer is established using the normal LIGA process by electroplating the metal into the recesses of a photoresist layer. The photoresist layer is then removed in its entirety. A secondary metal, which constitutes a sacrificial metal, is then electroplated over the previously deposited first layer of primary metal. The secondary metal is selected so that it will be differentially etched by a selected etchant which does not substantially attack the primary metal. The exposed surface of the deposited secondary metal is then machined down to a height which exposes the first metal, and which achieves a substantially flat, uniform surface extending across the primary and secondary metals. Machining also allows the thickness of the first layer of primary metal to be closely controlled. After the first layer of primary and secondary metals has been machined down to the desired height, additional layers may be formed on top of the first layer using the same procedure employing primary and secondary metals. A microstructure is thereby formed of multiple primary metal layers. The secondary, sacrificial, metal may be removed from around the primary metal structure using a selective etchant. The utilization of the secondary or sacrificial metal to completely cover each layer of the primary metal facilitates the machining of both the primary and secondary metals because of the mechanical stability which the secondary metal affords to the primary metal which it surrounds and supports. However, the formation of microstructures using this method requires a separate electroplating step to be performed at each level, and a final etching step to be performed to remove the sacrificial metal, thereby increasing the complexity of the metal microstructure fabrication process.

Multilevel processing to form metal microstructures may also be achieved using preformed photoresist sheets which are adhered together, and adhered to a substrate, before the electroplating process takes place. This process is described in U.S. Pat. No. 5,378,583, to Henry Guckel, et al., entitled Formation of Microstructures Using a Preformed Photoresist Sheet. The use of preformed photoresist sheets allows much thicker photoresist layers to be used than is possible with traditional photoresist layers which are cast in liquid form directly onto a substrate and then annealed. The preformed photoresist sheet layers may be exposed in a pattern, and may, but need not, be developed before they are adhered together or adhered to a substrate. Each layer may also be mechanically milled, using commercially available milling equipment, to a desired thickness. For example, a preformed photoresist sheet may be exposed to X-ray radiation to a depth only partially through the photoresist sheet, adhered to a substrate or second photoresist sheet, and then milled down to expose the X-ray exposed portion of the sheet. Exposed, developed, and milled photoresist sheets may be used individually, or combined in multiple layers, to form photoresist microstructures. Multi-layer photoresist structures may be adhered to a substrate as molds for the formation of electroplated metal microstructures or may, themselves, have independent utility. Milling of photoresist sheets in the conventional manner, however, introduces sheer forces which may, as described above, shred, tear, or otherwise damage the photoresist sheet.

SUMMARY OF THE INVENTION

In accordance with the present invention planarizing of photoresist and metal microstructure layers is achieved by lapping and polishing under controlled conditions. Lapping is used to remove material from the layer to planarize the layer. Polishing may then be used to apply a desired smooth finish to the layer surface. The present invention provides for z-dimensional height control of metal microstructures, which is necessary for the fabrication of precision microstructure devices, such as springs, in single level processing. The present invention also provides for the re-planarization of a photoresist and deposited metal layer, to bring the layer to a desired height and to smooth the surface of the layer, in preparation for the application of a subsequent photoresist and metal layer. Thereby, the present invention facilitates multilevel microstructure processing in addition to precise z-dimensional control and stability for single layer processing. The lapping and polishing method and apparatus of the present invention removes all excess metal and photoresist above the designed height from the photoresist-metal layer. After planarization in accordance with the present invention, the heights of the photoresist and metal will be the same. The planarized photoresist and metal surfaces will exhibit a smooth, nearly optical finish. The lapping and polishing method and apparatus of the present invention introduces relatively small shear forces, thereby preventing damage to the photoresist due to shredding or tearing, or loss of adhesion of the photoresist or metal layer from a substrate, and facilitating the production of z-dimension controlled vertically oriented structures that are much taller than they are wide.

The lapping and polishing method of the present invention employs a lapping machine that is furnished with a lapping plate having a lapping surface made of a soft metal, such as a copper composite. The lapping plate is conditioned to have a lapping surface that is preferably slightly concave in shape. The surface of the lapping plate is preferably conditioned using a diamond conditioning ring which produces ridges in the lapping surface. The grit of the diamond conditioning ring is selected based upon the particle size in the diamond slurry that will be used during the polishing process. After conditioning with the diamond conditioning ring, the lapping plate surface is thoroughly cleaned. Free diamonds in a liquid slurry are then sprayed onto the plate. A second conditioning ring, preferably made of a ceramic, is used to help embed the fine size diamonds from the slurry into the rough ridged surface of the lapping plate. The lapping plate is thereby made ready to remove material from a workpiece having photoresist or metal layers that need to be planarized.

The piece to be planarized may be mounted onto the lapping plate using various fixtures and techniques. For example, a commercial vacuum chuck hold down fixture having a thickness monitoring gauge, or wax mounting on a flat steel or glass mounting plate, may be used to mount the workpiece onto the lapping plate. Weights are preferably applied to the mounting fixture to increase the contact pressure between the lapping plate and the workpiece to a desired level. During the lapping process, the diamond slurry is periodically sprayed onto the lapping plate, and embedded into the lapping plate surface by the ceramic conditioning ring, as the lapping plate surface is rotated against the surface to be planarized. Shear forces, and the final finish of the planarized surface, are determined, in part, by the diamond size in the slurry. The amount of material removed from the workpiece is monitored during the lapping process. After an extended lapping duration, the cutting rate will decrease as the ridges formed in the surface of the lapping plate are worn out. At this point, the lapping plate surface may be cleaned and reconditioned using the diamond and ceramic conditioning rings.

For some metals, the lapping process of the present invention may cause metal from microstructures formed on a substrate to smear into adjacent photoresist areas. In such cases, a finish lapping step may be employed using a fine diamond slurry and lapping with moderate weight for a prolonged period of time to remove any smearing that exists. This finish lapping step is only used after the photoresist-metal layer has been reduced to within 10–15 μm of the final desired height of the micro part.

After lapping, and finish lapping if necessary, a polishing step may be employed. The polishing step uses a polisher with a hard (stainless steel) polishing plate covered by a polishing cloth saturated with a diamond slurry. The polishing step cuts an additional 3–4 μm of material from the layer being polished to produce a mirror-like finish on the workpiece at the specified photoresist-metal height.

The lapping and polishing method and apparatus of the present invention may also be used to remove material from preformed photoresist sheets, to planarize the surface of the sheets, and to provide the desired mirror-like finish to the sheets. Lapping and polishing of photoresist layers using the method and apparatus of the present invention enhances the ability to adhere photoresist sheets together by solvent bonding. Lapping and polishing of a photoresist sheet may be accomplished either before or after the photoresist sheet has been exposed to X-rays, either before or after exposed portions of the photoresist have been developed, and either before or after the photoresist sheet has been adhered to other sheets or applied to a substrate. Photoresist sheets that are planarized in accordance with the lapping and polishing method of the present invention may be used in combination with other similarly processed photoresist sheets to form photoresist laminate structures, having independent utilities, or, when adhered to a substrate, for producing multilevel electroplated metal microstructures.

Further objects, features, and advantages of the invention will be apparent from the following detailed description when taken in conjunction with the accompanying drawings.

BRIEF DESCRIPTION OF THE DRAWINGS

In the drawings:

FIG. 14 illustrates the use of a flatness gauge to measure the flatness of a lapping plate having a polishing surface which is concave between the center and outer edge of the lapping plate to be used in accordance with the present invention.

FIG. 15 illustrates the positioning of a diamond conditioning ring on the lapping plate of FIG. 14 for conditioning the lapping plate in accordance with the present invention.

FIG. 16 illustrates the further conditioning of the lapping plate in accordance with the present invention using a spray of diamond slurry and a ceramic conditioning ring.

DETAILED DESCRIPTION OF THE INVENTION

The lapping and polishing method and apparatus of the present invention may be utilized in the formation of single and multi-level microstructures carried out in LIGA processes and extensions thereof. An exemplary process for carrying out the formation of a metal microstructure employing the lapping and polishing method of the present invention is described briefly below. The details of LIGA processing itself are known to those having skill in the art. A detailed description of an exemplary process for carrying out the production of micromechanical structures is described, for example, in U.S. Pat. No. 5,190,637, to Henry Guckel, entitled Formation of Microstructures by Multiple Level Deep X-Ray Lithography with Sacrificial Metal Layers, the disclosure of which is incorporated herein by reference.

Figure 1:
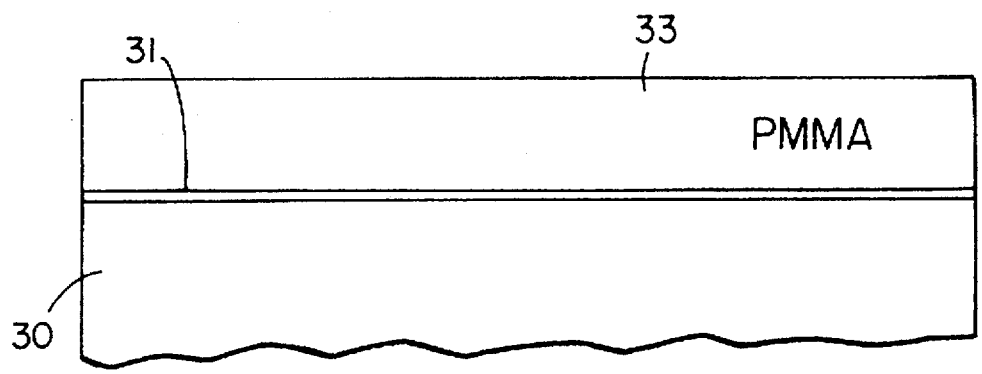
FIG. 1 is a simplified illustrative side view of a substrate with a plating base layer and photoresist layer formed thereon.

A basic process employing the lapping and polishing method and apparatus of the present invention to form a multilevel metal microstructure is illustrated with respect to the views of FIGS. 1–9. With reference to FIG. 1, a substrate 30 is provided which may comprise a variety of materials, including semi-conductors, insulators, and so forth. Typically, a metal plating base 31 will be deposited onto the top surface of the substrate 30, such as by sputtering. The substrate 30 could be composed of a conductive metal, in which case no plating base may be necessary. For the formation of parts to be freed from the substrate 30, a sacrificial release layer (not shown) may be used beneath the plating base layer 31. A photoresist layer 33, for example, polymethylmethacrylate (PMMA), is then applied to the substrate. Depending on the type of radiation used, the depth of exposure desired, and the properties of available photoresists, it is apparent that positive or negative photoresist may be used. The photoresist layer 33 may be cast-on to the desired thickness, or may be applied as a preformed photoresist sheet. The use of preformed photoresist sheets in the formation of metal microstructures is described in more detail in U.S. Pat. No. 5,378,583, to Henry Guckel, et al., entitled Formation of Microstructures Using a Preformed Photoresist Sheet, the disclosure of which is incorporated herein by reference. If a preformed photoresist sheet is used it may be exposed to radiation and development before being adhered to the substrate 30.

Figure 2:
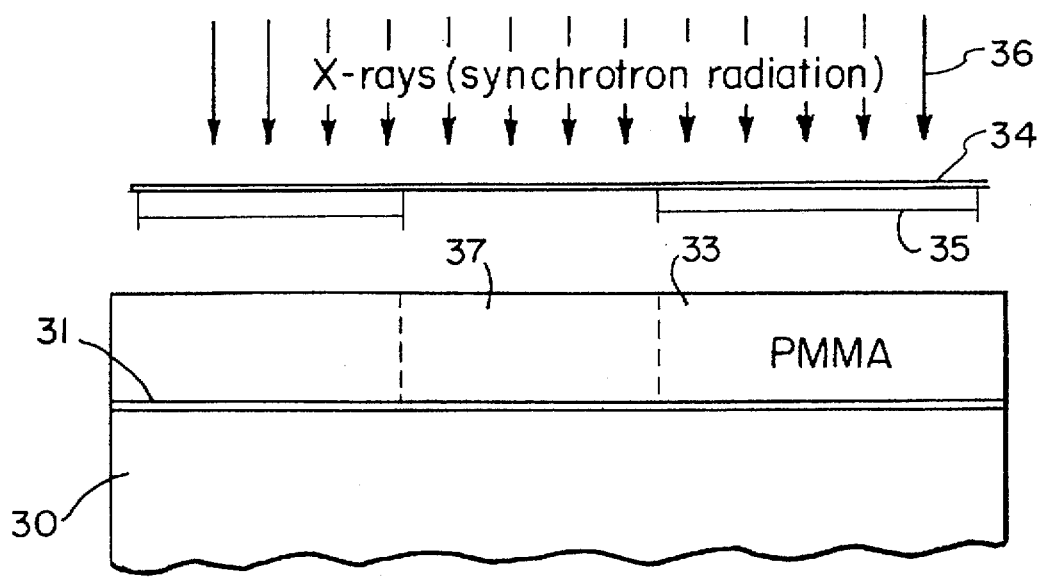
FIG. 2 is an illustrative view showing the photoresist and substrate of FIG. 1 exposed through an X-ray mask to X-ray radiation.
Figure 3:
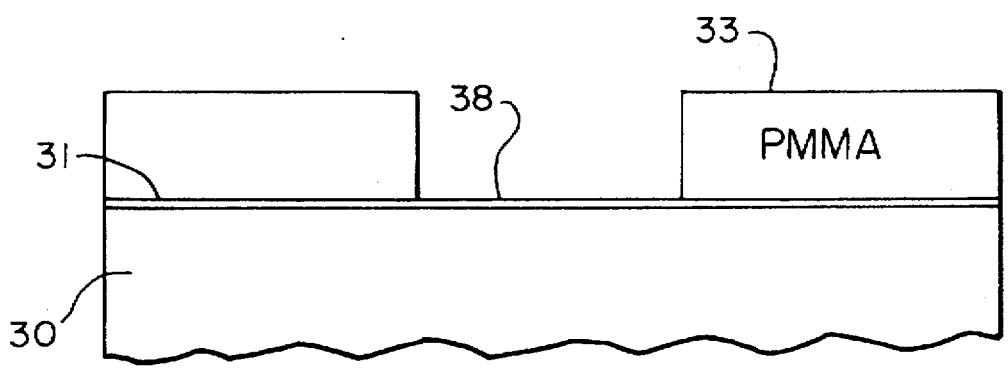
FIG. 3 is an illustrative view showing the substrate and photoresist of FIG. 2 after the exposed photoresist has been developed.

As illustrated in FIG. 2, an X-ray mask 34 having X-ray absorbing patterns 35 formed thereon, provides a pattern exposure from synchrotron radiation X-rays 36 to provide an exposed pattern 37 in the photoresist sheet 33. Although exposure of the photoresist 33 to radiation consisting of synchrotron X-rays 36 is preferred, to obtain structures of maximum depth and minimum run-out, it is apparent that the process may be used with other radiation, such as ultraviolet (UV) or non-synchrotron source X-rays, where thinner structures are acceptable. The exposed photoresist 37 is then developed using a highly selective developer to remove the exposed photoresist 37, leaving, as shown in FIG. 3, a patterned portion 38 of the plating base 31 exposed.

Figure 4:
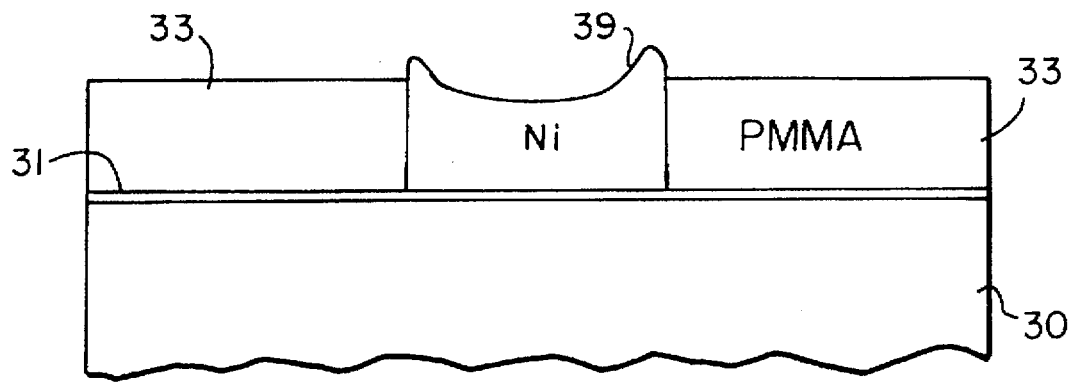
FIG. 4 is an illustrative view showing the substrate and photoresist of FIG. 3 after a metal microstructure has been electroplated onto the plating base in the area from which the exposed photoresist has been removed.

As shown in FIG. 4, a metal microstructure 39 is then electroplated onto the exposed portion 38 of the plating base 31. Note that a metal structure may be packed into the voids formed in the photoresist, rather than electroplated. A typical metal microstructure 39 may be made out of nickel; however, a variety of other metals may also be used to form the microstructure 39, as is known in the art. In the electroplating process, the plating rate is dependant, in part, upon the pattern in the photoresist 33 that is used to form the microstructure. Uniform deposition of the electroplated metal 39 is very difficult to achieve. Therefore, direct height control of the electroplated metal structure 39 is very difficult, resulting in a microstructure 39 having an uneven upper surface. As illustrated in FIG. 4, z-dimension variation in the electroplated structure 39 can be extreme. This is especially apparent near the walls of the well formed by the photoresist layer 33, where additional material may be deposited having z-dimension thickness on the order of the final desired microstructure height itself.

Tight control of the z-dimensional height of the metal microstructure 39 is necessary in order to fabricate precision microstructure devices, such as springs, in single level processing. Moreover, the formation of microstructures using multilevel processing requires that the first photoresist-metal layer be planarized prior to securing subsequent photoresist-metal layers. Re-planarization is needed to properly adhere a subsequent photoresist layer to the first photoresist-metal layer below, and for proper adhesion of a second electroplated metal layer onto the first layer. Precise engineering and multilevel processing without re-planarization are typically not possible.

Figure 5:
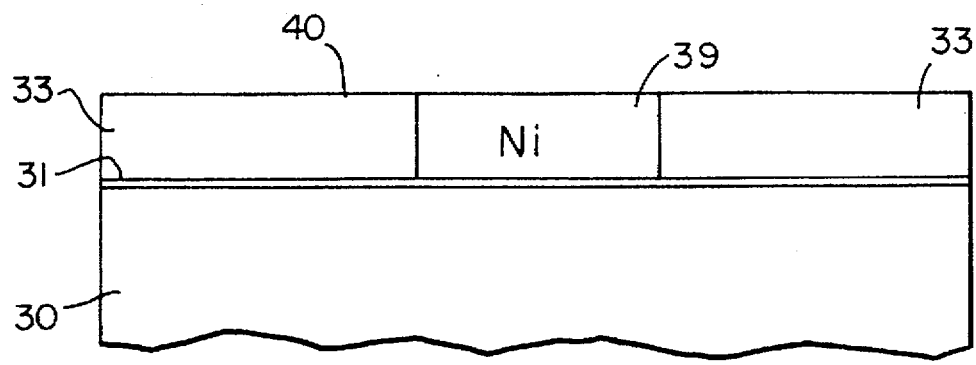
FIG. 5 is an illustrative view showing the substrate, photoresist, and metal microstructure of FIG. 4 after the photoresist-metal layer has been re-planarized using the lapping and polishing method and apparatus of the present invention.

Thus, the next step in the formation of a metal microstructure, for either single level or multilevel processing, is the re-planarization of the photoresist-metal layer using the lapping and polishing method and apparatus of the present invention. The resulting structure, having re-planarized surface 40, is shown in FIG. 5. The lapping method and apparatus of the present invention removes all excess metal from the microstructure 39 above the designed height. Some of the photoresist 33 is also removed at essentially the same rate, resulting, after re-planarization, in the photoresist layer 33 and metal microstructure 39 having the same thickness. The polishing method and apparatus of the present invention provides a planarized photoresist-metal surface structure 40 that exhibits a nearly optical finish. During the lapping and polishing process, shear forces applied to the photoresist 33 and microstructure 39 are kept small to prevent loss of adhesion between the microstructure 39 or photoresist 33 and the plating base 31 or substrate 30 beneath them. This facilitates the fabrication of vertically dimensioned microstructures that are significantly more high than wide. For example, the lapping and polishing method of the present invention has been used in the fabrication of electrostatic activators including 350 micron tall posts that are 100 microns in diameter. Reduced shear forces also prevent tearing, shredding, or other damage to the surface of the photoresist 33. The lapping and polishing method and apparatus of the present invention are described in more detail below.

Figure 6:
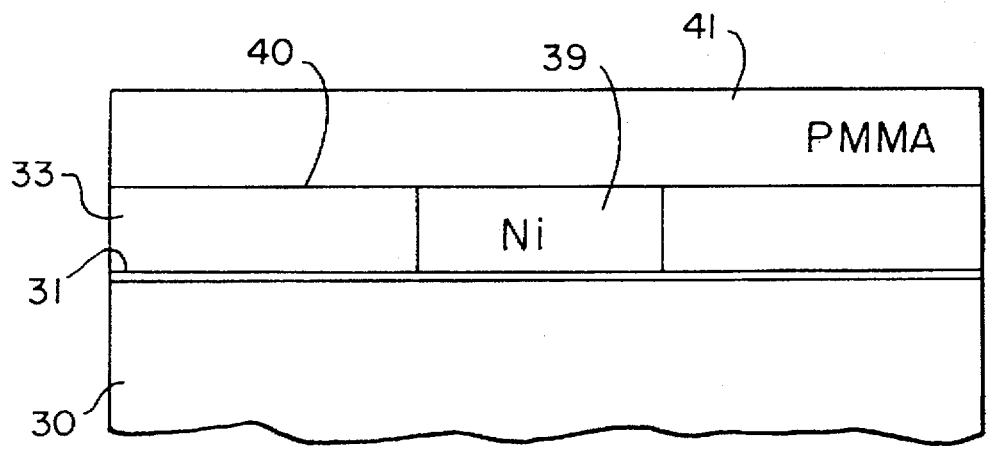
FIG. 6 is an illustrative view of the substrate and planarized photoresist-metal layer of FIG. 5 with a second layer of photoresist formed thereon.
Figure 7:
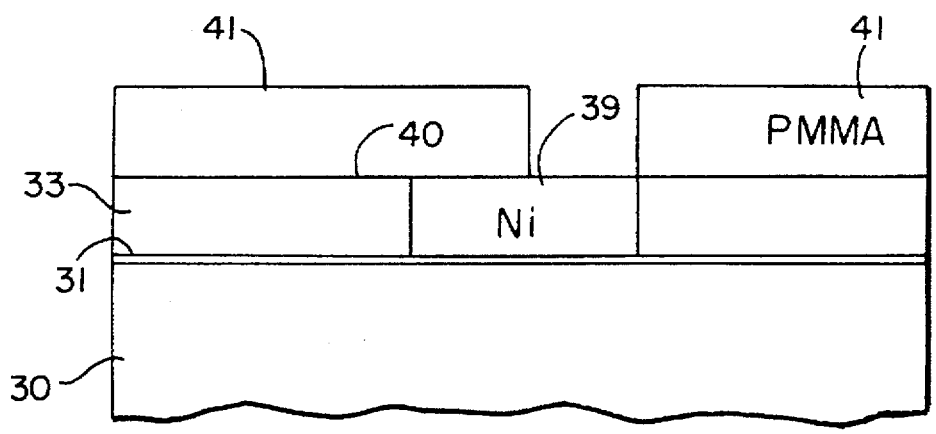
FIG. 7 is an illustrative view showing the multi-layered structure of FIG. 6 after the second layer of photoresist has been exposed through an X-ray mask to X-ray radiation and after the exposed portion of the second layer of photoresist has been developed.
Figure 8:
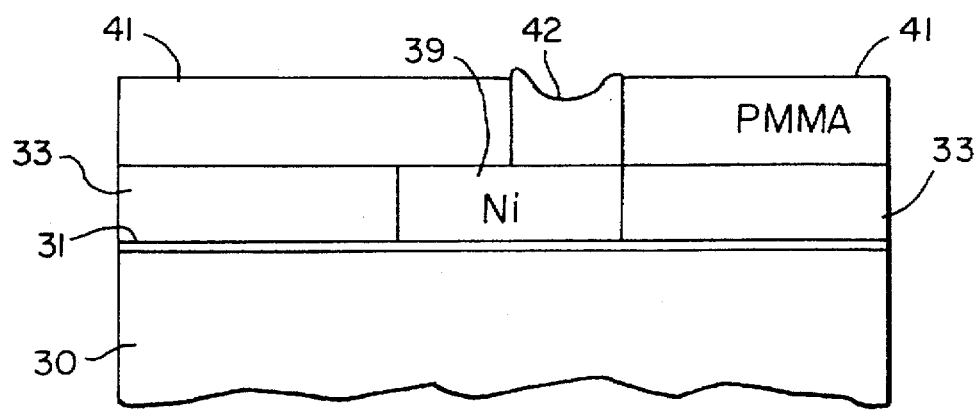
FIG. 8 is an illustrative view showing the multi-layer structure of FIG. 7 wherein a second metal layer has been electroplated into the portion of the second layer of photoresist which has been removed and onto the first electroplated metal layer.
Figure 9:
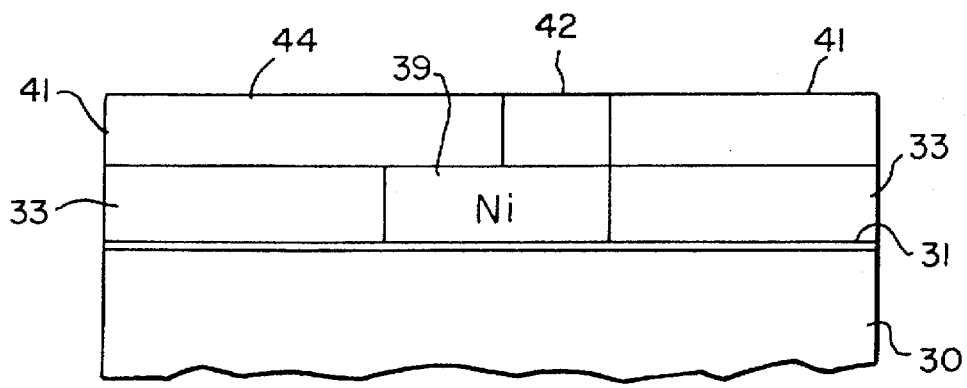
FIG. 9 shows the multi-layer structure of FIG. 8 after the second photoresist-metal layer has been re-planarized using the lapping and polishing method and apparatus of the present invention.

After the photoresist-metal surface 40 has been re-planarized using the lapping and polishing method and apparatus of the present invention, the excess photoresist 33 and plating base 31 may be removed, the microstructure 39 may be removed from the substrate 30 (using a sacrificial release layer), or the microstructure fabrication process may proceed for the formation of a multilevel microstructure. As shown in FIG. 6, a second layer 41 of photoresist may be applied on top of the planarized photoresist-metal surface 40. The smooth surface 40, having been lapped and polished in accordance with the method and apparatus of the present invention, allows for better adhesion between the photoresist layers 33 and 41. As described above, the second photoresist layer 41 may be cast on in a traditional manner, or applied as a preformed photoresist sheet to the re-planarized surface 40. As noted above, if a preformed photoresist sheet is used to form the second photoresist layer 41, the photoresist sheet may be exposed to radiation and developed before being applied to the planarized photoresist-metal surface 40. The second photoresist layer 41 is then exposed to X-rays in a pattern using an X-ray mask, and developed to form a structure, such as is shown in FIG. 7, wherein a portion of the second photoresist layer 41 is removed to expose the planarized surface 40 of the first metal microstructure layer 39. A second layer of metal 42 is then electroplated onto the first metal layer 39 to form a multilevel microstructure as shown in FIG. 8. As discussed above, the electroplating process does not allow z-dimensional height control of the deposited metal 42. Variations in the height of the deposited structure 42 can be extreme. The second photoresist-metal layer may, therefore, preferably be re-planarized, using the lapping and polishing method and apparatus of the present invention, to remove excess metal from the second metal layer 42, to reduce the second metal layer 42 to the designed height, and to re-planarize the photoresist-metal layer so that the photoresist and metal thicknesses are same and so that the photoresist and metal surfaces exhibit a nearly optical finish. The resulting structure, having a re-planarized surface 44 on the second photoresist-metal layer, is shown in FIG. 9. The second surface 44 is thus now prepared for the application of additional photoresist and metal layers, in the manner described above, for the formation of microstructures having even more metal layers. The process may also be stopped at this point, and the remaining photoresist layers 33 and 41 removed to provide a free-standing multilevel metal microstructure composed of the two metal layers 39 and 42. Also, the metal microstructure may be removed from the substrate 30, to form a freed metal microstructure, using a sacrificial release layer (not shown).

The present invention employs a diamond lapping and polishing technique in which re-planarization of photoresist and metal surfaces, and polishing to a nearly optical finish, is achieved while shear forces are minimized. In the following description, the term "lapping" is used to refer to the removal of material from a surface, at a relatively high rate, using diamonds embedded in a lapping plate. "Polishing" refers to the application of a smooth optical finish to a surface using a free non-embedded diamond slurry typically embedded in a polishing cloth. Polishing is used following lapping, and removes little additional material from the surface being polished.

Figure 10:
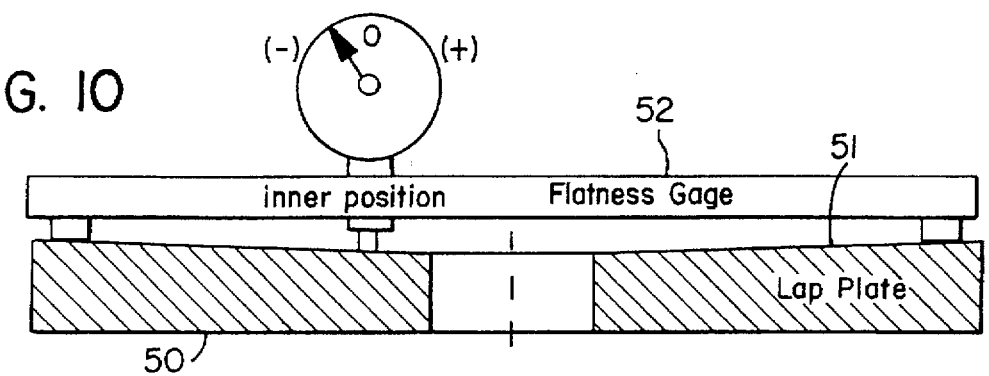
FIG. 10 illustrates the use of a flatness gauge to measure the flatness of a concave lapping plate to be used in accordance with the present invention.

In lapping a work piece in accordance with the present invention, a conventional lapping machine, such as an LM 115 Hyprez Lapping Machine, available from Engis Corp., Wheeling, Ill., is used. The lapping machine is furnished with a lapping plate 50, as shown in FIG. 10. The lapping plate 50 has a lapping surface 51 made of a soft metal material. For example, a 15 inch diameter lapping plate 50 made of a copper composite with polymers may preferably be used. Such a copper composite lapping plate is also available from Engis Corp. The flatness of the lapping plate 50 is preferably determined using a flatness gauge 52, also available from Engis Corp. The flatness gauge 52 is preferably calibrated on a flat granite block. The lapping plate surface 51 is preferably slightly concave at its center with respect to its outer edge. Thus, as shown in FIG. 10, the flatness gauge 52 will show a negative reading at an inner position near the lapping plate's center. The concavity of the lapping plate may preferably be 0.0002 to 0.0005 inches of concavity at the center of the lapping plate 50 with respect to the outer edge of the lapping plate 50. (The concavity shown in FIG. 10 is exaggerated for illustration purposes.) It is important to maintain concavity of the lapping plate 50 so that the lapping plate 50 will have a near perfectly flat surface 51 (zero mil flatness) when used during the lapping process. The copper composite material which forms the lapping plate 50 undergoes expansion over time. It is difficult to bring the lapping plate 50 to zero mil flatness if it is in a convex position. This, in turn, will adversely affect the z-dimensional stability of the lapping process.

Figure 11:
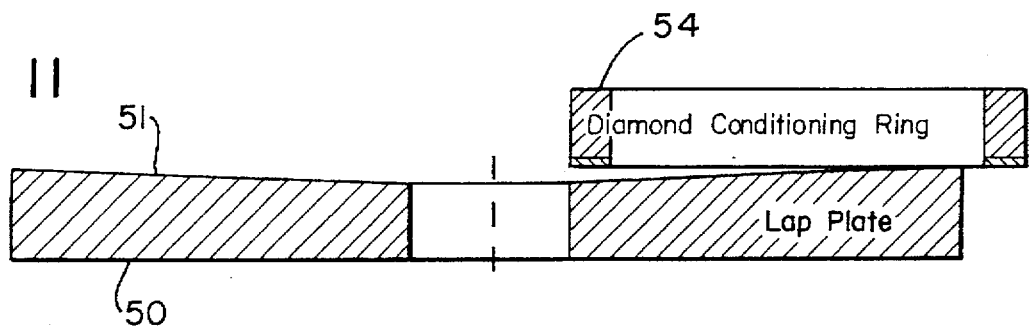
FIG. 11 illustrates the positioning of a diamond conditioning ring on the concave lapping plate of FIG. 10 to condition the lapping plate in accordance with the present invention.

The lapping plate 50 is conditioned to form small ridges of controlled height in the lapping surface 51. The lapping plate 50 may preferably be conditioned using a diamond conditioning ring 54 as shown in FIG. 11. The diamond conditioning ring 54 has a surface 56 embedded with diamonds which form the ridges in the surface 51 of the lapping plate 50 when the plate 50 is rotated while in contact with the ring 54. Diamond conditioning rings 54 of various grits are available from Engis Corp. A course grit conditioning ring (60–80 grit) is preferably used if the lapping process is to employ a diamond slurry having diamond particles greater than 10 μm in size. Otherwise, a finer grit diamond conditioning ring (140–170 grit) may be used. For a copper-composite lapping plate 50, the lapping plate 50 should preferably always be wet with W-Lubricant (also available from Engis Corp.) before diamond conditioning. A typical duration for diamond conditioning is 2 minutes at 60 rpm rotation of the lapping plate 50, but will depend on the slurry size used.

Figure 12:
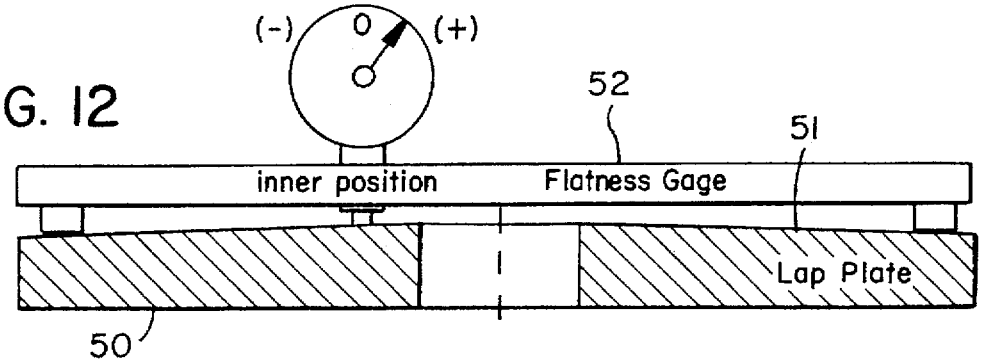
FIG. 12 illustrates the use of a flatness gauge to measure the flatness of a convex lapping plate to be used in accordance with the present invention.
Figure 13:
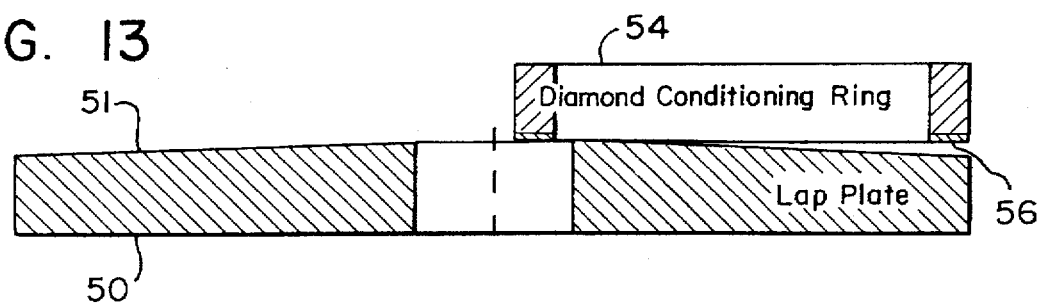
FIG. 13 illustrates the positioning of a diamond conditioning ring on the convex lapping plate of FIG. 12 to condition the lapping plate in accordance with the present invention.

Diamond conditioning applies a rough ridged surface 51 to the lapping plate 50, and may also be used to obtain the desired concavity of the lapping plate. The position of the diamond conditioning ring 54 during the conditioning process may preferably be determined depending on the initial flatness of the lapping plate 50. The preferred position of the conditioning ring 54 for a concave lapping plate 50 is shown in FIG. 11. For a convex lapping plate 50, as shown in FIG. 12, the flatness gauge 52 will show a positive reading at an inner position of the lapping plate near the center of the lapping plate 50. The preferred position of the diamond conditioning ring 54 for a convex lapping plate 50 is shown in FIG. 13. As shown, one edge of the conditioning ring 54 is aligned with the outer edge of the lapping plate 50. FIG. 14 shows a lapping plate 50 in which the lapping plate surface 51 is hollow or concave between the outer edge and center of the lapping plate 50. For such a lapping plate 50, the flatness gauge 52 will show a negative reading at a center position between the center and outer edge of the lapping plate 50. For this type of lapping plate, the preferred position of the diamond conditioning ring 54 is shown in FIG. 15. As shown, the diamond conditioning ring 54 is centered over the concavity in the lapping plate surface 51.

After diamond conditioning, the lapping plate 50 is thoroughly cleaned so that wipes of the lapping plate surface with a clean cloth do not show any traces of copper particles remaining on the plate. The flatness of the lapping plate 50 is then preferably re-measured, using the flatness gauge 52, and the plate re-conditioned, if necessary, in order to obtain the desired concavity.

A second conditioning step follows the diamond conditioning. During this step, as shown in FIG. 16, free diamond particles in a liquid slurry 58 are sprayed from a nozzle 60 onto the surface 51 of the lapping plate 50. Diamond lapping/polishing slurries are available from Engis Corp. in a wide variety of diamond particle sizes (0.5 µm 30 µm) suspended in a mineral oil. The diamond particle size used depends upon the finish of the polished surface and rate of material removal and polishing which are desired. Diamond size also affects the shear forces which will be applied to the surface being lapped. During this second conditioning step, the diamond slurry 58 is sprayed onto the surface 51 of the lapping plate 50 for preferably approximately 5 seconds with the plate rotating at approximately 50 rpm. A clean and dry ceramic conditioning ring 62 is then placed on the lapping plate 50, at one of the roller arms on the polishing machine, ahead of the spray position. The ceramic conditioning ring 62 is preferably centered over the lapping surface of the lapping plate 50, as shown. The ceramic conditioning ring 62, also available from Engis Corp., helps to embed the fine sized diamonds from the slurry 58 into the lapping plate 50, specifically, into the ridges formed by the diamond conditioning ring 54 during the first conditioning step. This prevents the diamonds from rolling on the lapping plate surface during the lapping process. With the ceramic conditioning ring 62 in place, the second conditioning step may preferably proceed for approximately 1 minute with the nozzle 60 dispensing the diamond slurry 58 onto the surface 51 of the lapping plate 50 for 3–4 seconds after a 40 second interval. The conditioned lapping plate 50 is now prepared for lapping a workpiece, such as a substrate wafer upon which a photoresist-metal layer has been deposited, or similar microstructure parts.

Figure 17:
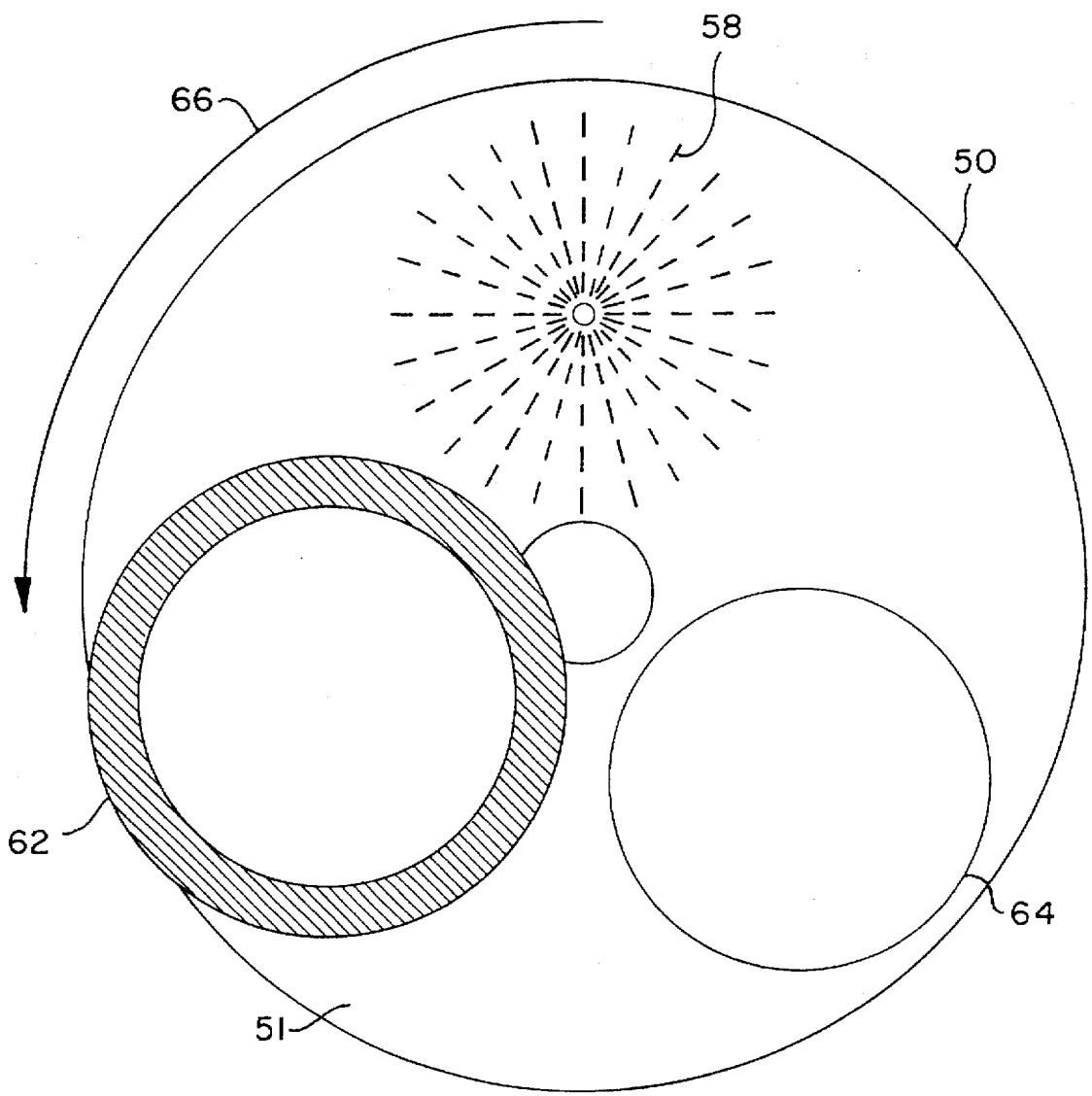
FIG. 17 illustrates the relative positions on the lapping plate of the diamond slurry spray, the ceramic conditioning ring, and a workpiece during planarization of the workpiece in accordance with the lapping and polishing method of the present invention.

The workpiece to be lapped is mounted onto the lapping plate 50 for lapping. A piece to be lapped may, for example, be mounted on the plate using the vacuum holddown on an Accupol Vacuum Fixture, from Lapmaster. This device has a built-in thickness monitoring capability. The Accupol Vacuum Fixture may be placed on a flat granite block to zero the thickness monitoring gauge on the fixture. The electroplated wafer substrate, or other piece to be lapped, is then mounted on the vacuum chuck of the fixture, and the fixture is placed on the lapping plate 50 ahead of the ceramic conditioning ring 62. The angle between the vacuum chuck and the lapping plate surface 51 is preferably as close to 90° as possible. The relative positions on the lapping plate surface 51 of the diamond slurry spray 58, ceramic conditioning ring 62, and workpiece to be lapped 64, with respect to the rotation of the lapping plate 50, indicated by arrow 66, are as shown in FIG. 17. Weights are applied to the mounting fixture to bring the contact pressure between the workpiece 64 and the surface 51 of the plate 50 to a maximum of 5 psi. The weight to be placed on the micro part being lapped is based on the geometry and dimensions of the parts. Small sized structures (e.g., 100µm×100µm parts, 50µm high) require the starting weight to be minimized in order to avoid adhesion losses due to shear forces. Increased contact pressure may be required to lap large dimension parts. Weights, conditioning rings, etc., should not be left on the lapping plate 50 when it is not in use.

The lapping process may begin by starting rotation of the lapping plate 50 at, e.g., 25 rpm and increasing the rotation slowly to 40 rpm. The diamond slurry 58 is preferably dispensed for 2–3 second periods at regular intervals of 30–40 seconds. Shear forces applied to the piece being lapped, and the characteristics of the surface finish finally achieved, are controlled in part by the diamond size in the slurry. Larger slurry size results in larger shear forces and a rougher final finish.

The lapping method and apparatus of the present invention reduces shear forces by the use of the diamond slurry 58 in combination with the soft metal lapping plate 50. As lapping proceeds, the diamond particles embedded in the ridges of the lapping plate 50 will be dislodged from the lapping plate 50 as shear forces increase, rather than causing damage to the photoresist or metal layer being lapped. Thus, lapping of a photoresist-metal layer can be accomplished without loss of adhesion between the photoresist-metal layer and the substrate beneath due to high shear forces. The risk of tearing or shredding of the photoresist layer surface is similarly reduced.

The lapping plate 50 should periodically be re-conditioned using the diamond and ceramic conditioning rings in the manner described above. Re-conditioning should preferably occur after every 20–30 minutes of lapping, or when the cutting rate decreases significantly (by over 50%). The lapping plate 50 is preferably cleaned with de-ionized water and a soap solution, and thoroughly dried, before it is re-conditioned using the diamond and ceramic conditioning rings and the process described earlier. Re-conditioning is necessary because, after some time, the ridges formed in the surface of the lapping plate 50 during the initial conditioning using the diamond conditioning ring 54 become worn out.

Figure 18:
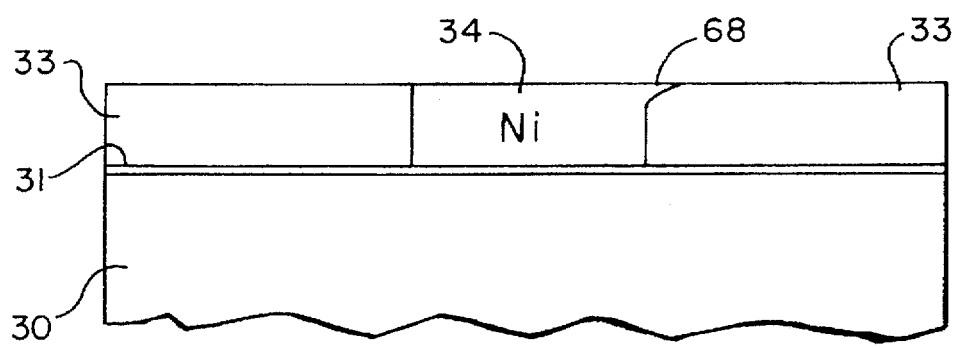
FIG. 18 is an illustrative view of a substrate having a photoresist-metal layer which has been initially planarized in accordance with the present invention, showing smearing of the electroplated metal which may result.

The amount of material cut from the piece being lapped 64 is monitored during the lapping process using the thickness gauge on the vacuum fixture. For some electroplated metals, the lapping process just described will cause metal from a microstructure to smear into adjacent photoresist areas. This smearing 68 is illustrated in FIG. 18 which shows the substrate with photoresist and metal layer of FIG. 4 after initial lapping using the method just described. This smearing is generally not acceptable. Thus, when the structure height of the workpiece 64 is reduced to within 20–30 microns of the final desired height, it is preferable that a finish lapping step be used. The lapping plate 50 is reconditioned, as described above, and finish lapping proceeds using a 1 µm diamond slurry and a moderate contact pressure weight of 2–3 psi at a rotational speed of 40 RPM for a prolonged period of time. The finish lapping step removes an additional 15–25 µm of material from the surface being lapped. This removes any smearing 68 from the workpiece surface. Finish lapping is preferably interrupted to inspect the workpiece surface when the height is within 10 µm of the final desired height. If some smearing remains, the weight on the lapping parts may be increased to increase the contact pressure during the finish lapping step. At the completion of this step all electroplated areas on the surface of the workpiece 64 should be in contact with the lapping plate surface 51. When the desired thickness (structure height) is reached, the piece 64 is removed from the lapping plate 50. In order to remove the vacuum fixture from the plate 50, it is slid radially outward, and never lifted vertically up from the lapping plate 50.

Once the lapped parts are reduced to within 3–5 µm of the final desired height, a polishing step is preferably used to apply a final smooth finish to the workpiece surface. This additional polishing step is accomplished using a hard polishing plate covered by a polishing cloth. For example, a stainless steel plate with a surface flatness of 0.0002 inches, covered with a self adhesive or PSA backed nylon polishing cloth, supplied by Beuhler Corp., may be used. This cloth covered polishing plate is preferably used on a separate polishing or lapping machine from the lapping machine upon which the initial diamond lapping steps of the present invention take place. The polishing cloth is initially saturated with a 1 µm diamond polishing slurry available from Engis Corp. Preferably, the workpiece 64 and workpiece holder are cleaned thoroughly before mounting the workpiece 64 on the polishing machine. This will prevent any particles from the lapping machine from being transferred to the polishing machine. Use of a separate vacuum holder for each separate lapping or polishing machine is preferred. Finish polishing preferably proceeds for approximately 15 minutes with a polishing plate rotation rate of 80 rpm. Finish polishing preferably cuts an additional 3–4 µm of material from the surface to be polished. The final polishing step produces a work piece with a polished mirror-like finish at the specified structure height.

The lapping and polishing method just described has been used to re-planarize the surface of photoresist-metal layers including metal microstructures made of nickel, nickel/iron, and copper. Surface profilometry of the lapped and polished samples reveal height variations within individual microstructure parts of substantially less than 0.5 µm, and variations of 1–2 µm over an entire area of 50×30 mm. Scanning electron micrographs of the sample show no smearing of lapped and polished parts.

Figure 19:
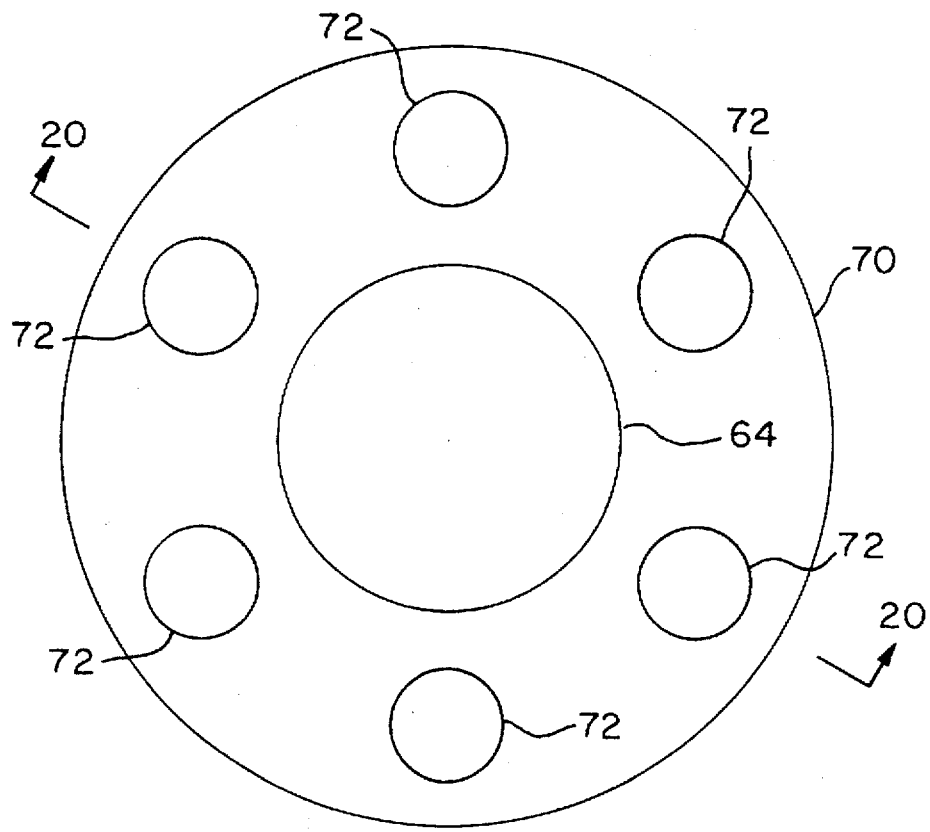
FIG. 19 is an illustrative plan view of a mounting plate upon which a workpiece to be lapped has been mounted along with glass support pieces.
Figure 20:
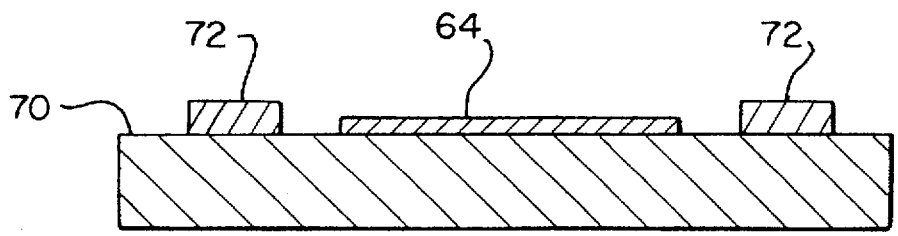
FIG. 20 is an illustrative cross-sectional view of FIG. 19 taken along the line 20—20.

A variation on the lapping and polishing method and apparatus of the present invention just described may be accomplished using a steel or glass mounting plate, instead of the vacuum fixture, for supporting the workpiece 64 on the lapping plate 50. The mounting plate 70, shown in FIG. 19, may preferably be made of glass or steel and may be approximately 6 inches in diameter, with both surfaces paralleled and flattened to a tolerance of less than $5 \times 10^{-5}$ inches. The mounting plate 70 is heated to approximately 55°–60° C. A wax, e.g., the low temperature wax made by Hyprez, and available from Engis Corp., is melted onto the mounting plate 70. The workpiece 64 is placed on the center of the mounting plate 70, and is secured thereto by the hardening of the wax. Glass support pieces 72 are also secured to the mounting plate 70 using the wax. During the time period when the wax is cooling, some weight may be applied to the plate to assure good adhesion between the glass support pieces 72 and the mounting plate 70. The glass support pieces 72 may preferably be 10 mm×10 mm, or 10 mm diameter glass pieces, which are approximately 1500 µm thick, and arranged in a hexagon arrangement near the edge of the mounting plate 70 and surrounding the workpiece 64 mounted in the center of the mounting plate 70. The glass support pieces 72 are thicker than the heights of any structures plated onto the workpiece 64 to be polished. This is illustrated in the cross-sectional view of FIG. 20.

After the lapping plate 50 has been conditioned using the diamond conditioning ring 54, the ceramic conditioning ring 62, and the procedure described earlier, the mounting plate 70 may be positioned on the lapping plate to begin the lapping process. Weights are placed on the back of the mounting plate 70 in order to bring the contact pressure between the glass support pieces 72 and the polishing surface 51 of the lapping plate 50 to a maximum of 5 pounds per square inch (psi). The glass support pieces 72 are then lapped using a 60 rpm plate rotation and a 30 µm diamond slurry dispensed for 3–4 seconds at approximately 40 second intervals until the glass support pieces 72 are reduced to a height approximately 400 µm higher than the final desired height of the piece being polished. The heights of the glass support pieces 72 are measured periodically during the lapping process. Lapping should not proceed for more than ten minutes in one continuous cycle before the heights of the glass pieces 72 are remeasured. After each measurement, the positions of the weights placed on the back of the mounting plate 70 are adjusted, to adjust the contact pressure between each glass piece 72 and the lapping plate 50, to thereby level the thicknesses of the glass support pieces 72. This is done to minimize the ultimate height variations across the workpiece 64.

The lapping plate 50 is then re-conditioned using the diamond conditioning ring 54, ceramic conditioning ring 62, and the conditioning procedure described earlier. Since a smaller diamond slurry size will now be used for lapping, a finer grit diamond conditioning ring is preferably employed during the conditioning process. Lapping of the glass support pieces 72 and workpiece 64 then proceeds using a 15 µm diamond slurry, until the structure being lapped is within 10–15 µm of the final desired height. Once again, the height of the glass support pieces 72 is periodically measured, and the positions of the weights on the mounting plate 70 are periodically adjusted, to level the heights of the glass support pieces. At the completion of this phase of the lapping process, the glass support pieces 72 should have height variation tolerances within 5 µm.

The lapping plate 50 is preferably once again re-conditioned using the diamond conditioning ring 54, ceramic conditioning ring 62, and conditioning procedure described earlier. Since a relatively small diamond slurry size will be used for the next lapping step, a fine grit diamond conditioning ring 54 is preferably employed in the conditioning procedure. Finish lapping of the workpiece 64 may then proceed, using a diamond slurry size of 1 µm, for removing a final 15–20 µm of material from the piece 64. During this lapping step, the duration of the slurry dispensing period is preferably increased to approximately 5 seconds, and the dispensing interval is reduced to approximately 20 seconds. After the workpiece 64 is reduced to its desired height, the mounting plate 70 is removed from the lapping plate 50. Preferably, a finish polishing step, using a hard polishing plate covered by a polishing cloth saturated with a diamond slurry as described above, may be used to apply the final mirror-like finish to the piece being polished. To remove the workpiece 64 from the mounting plate 70, the mounting plate is re-heated, and the workpiece 64 slid gently off. Trichloroethylene (TCE) may be used to dissolve any residual wax from the back of the workpiece substrate 64.

The alternative lapping and polishing method and apparatus just described, using a mounting plate 70 instead of a vacuum holddown fixture, produces the same desirable surface finish as the lapping and polishing procedure described earlier. As with the previously described procedure, the use of a diamond slurry for lapping allows planarization of photoresist and metal microstructure layers, while minimizing the risk of loss of adhesion of the photoresist or metal, and shredding or tearing of the photoresist, due to the high shear forces present in previously known cutting and milling processes.

As previously discussed, the lapping and polishing method and apparatus of the present invention is well suited for the re-planarization of photoresist-metal layers needed for the fabrication of precision single level and multilevel microstructures. The present invention may also be employed, however, for the planarization and height reduction of preformed photoresist sheets which are used either for the formation of metal microstructures, or as photoresist structures having independent utility. The reduced shear forces made possible by the lapping and polishing method and apparatus of the present invention makes it particularly well suited for the removal of material from preformed photoresist sheets, because the risk of shredding or tearing the photoresist sheet, or of causing loss of adhesion between photoresist sheets or between photoresist sheets and substrates of other materials, is minimized.

Figure 21:
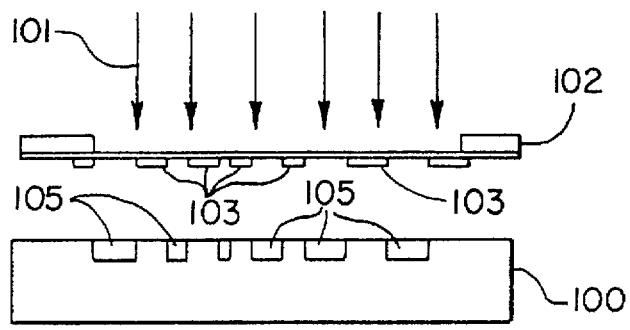
FIG. 21 is an illustrative side view of a relatively thick preformed photoresist sheet being exposed through an X-ray mask to X-ray radiation.
Figure 22:
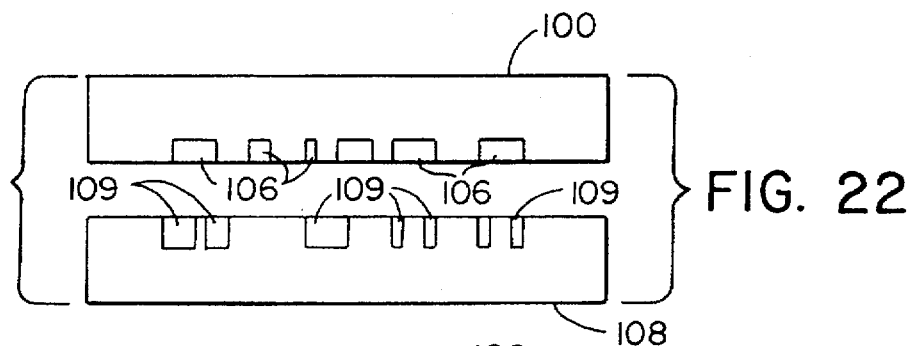
FIG. 22 is an illustrative view of two relatively thick preformed photoresist sheets which have been exposed to X-rays in the manner illustrated in FIG. 21 and which have been developed to remove the exposed photoresist.
Figure 23:
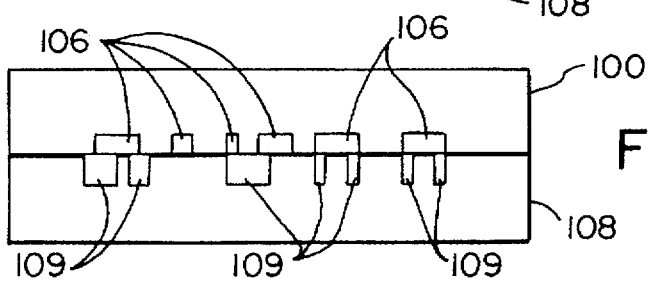
FIG. 23 is an illustrative view showing the two layers of preformed, exposed, and developed photoresist sheets of FIG. 22 bonded together at their exposed surfaces.
Figure 24:
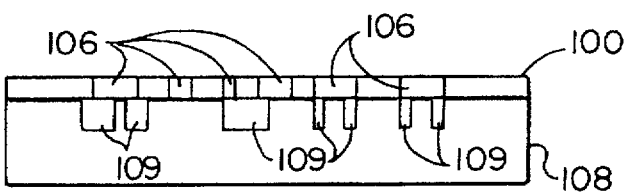
FIG. 24 is an illustrative view of the photoresist layers of FIG. 23 after the top layer has been planarized down using the lapping and polishing method and apparatus of the present invention to fully expose the developed regions of the top photoresist layer.
Figure 25:
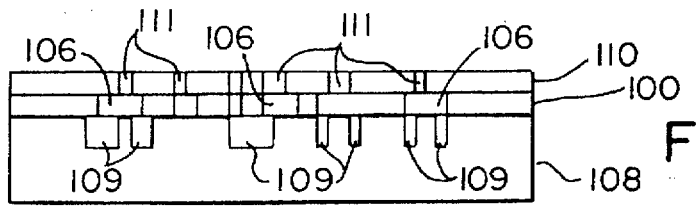
FIG. 25 is an illustrative view of the photoresist layers of FIG. 24 with the addition of another photoresist layer which is formed in the manner illustrated above with respect to FIGS. 21–24.
Figure 26:
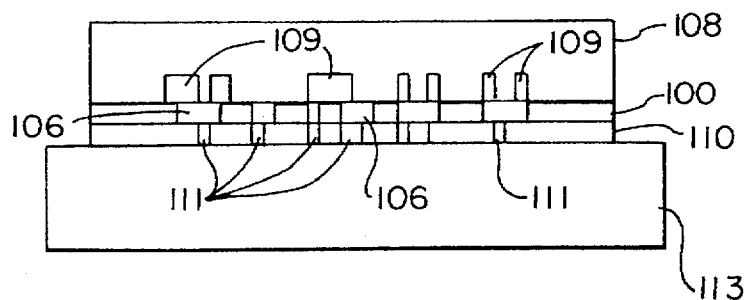
FIG. 26 is an illustrative view of the multi-layer photoresist laminate of FIG. 25 with the free surface of the top layer bonded to a substrate and before lapping and polishing of the thick photoresist layer in accordance with the lapping and polishing method and apparatus of the present invention.

An exemplary microstructure fabrication process employing preformed photoresist sheets, in which the lapping and polishing method and apparatus of the present invention may be employed, is described with reference to FIGS. 21-26. Referring to FIG. 21, a relatively thick (e.g., 1-3 mm) preformed photoresist sheet 100 is exposed to X-rays 101 passed through an X-ray mask 102 having X-ray absorbers 103 thereon in patterns which result in regions 105 in the pre-formed sheet 100 which are sufficiently exposed to X-rays to be removed by developer, but with the regions 105 extending only part way through the thickness of the photoresist sheet 100. The photoresist sheet 100 is then exposed to a liquid developer which removes the exposed photoresist to form void regions 106, as shown in FIG. 22. Another photoresist sheet 108 is formed by a similar process to have void regions 109 therein. The two relatively thick photoresist sheets 100 and 108 are then bonded together at their exposed surfaces in a properly aligned manner so that the void regions 106 and 109 properly align with each other, as illustrated in FIG. 23. The layer 100 may then be planarized using the lapping and polishing method and apparatus of the present invention to remove photoresist material from the layer 100 and reduce the layer 100 to a thickness wherein the regions 106 are fully exposed, as illustrated in FIG. 24. Use of the lapping and polishing method of the present invention to reduce the photoresist layer 100 allows the height of the layer 100 to be controlled within strict tolerances, produces a mirror-like surface on the photoresist layer 100, and may be accomplished with minimal risk of damage to the photoresist layer 100. As shown in FIG. 25, a further photoresist sheet 110, having open regions 111 thereon, may be formed on the two layers 100 and 108 in an entirely identical manner employing the lapping and polishing method of the present invention to reduce the height of the photoresist sheet 110. After the desired number of layers are formed in the laminate, the laminate may, if desired, then be bonded to a substrate 113 which has a surface thereon appropriate for electrodeposition of a multilevel metal microstructure, as illustrated in FIG. 26. The now top layer photoresist sheet 108 may then be reduced in height using the lapping and polishing method of the present invention to reduce the thickness of the sheet 108 to a thickness which exposes the open regions 109, allowing electrodeposition of metal into all of the regions 109, 106, and 111. However, it should be understood that the laminate of layers 108, 100 and 110 of photoresist may itself have independent utility without being bonded to a substrate as a mold for electrodeposition. For example, the open regions 106, 109, and 111 may comprise multiple fluid channels to allow routing of liquids or gasses through the laminate for use in pressure sensors, alarm devices, hydraulic or pneumatic actuators, etc. Precise control of the size of the channels thus formed is achieved by the lapping and polishing method of the present invention which allows controlled reduction of the photoresist sheets of which the laminate is formed to the desired thicknesses. The smooth mirror-like surfaces achieved by the polishing method of the present invention also enhances the ability of multiple photoresist sheets to be securely adhered together by solvent bonding (using, e.g., a chemical composite of PMMA). Surface tension forces when using the solvent bonding technique are very large when the surfaces being bonded together are very smooth.

It is understood that the invention is not confined to the particular embodiments and exemplary applications set forth herein as illustrative, but embraces all such modified forms thereof as come within the scope of the following claims.

What is claimed is:

1. A method for lapping a workpiece including a microstructure layer formed of photoresist or metal, comprising the steps of:

(a) furnishing a lapping machine with a lapping plate having a lapping surface made of a soft metal;
   (b) conditioning the lapping plate to furnish the lapping plate surface with a rough ridged surface;
   (c) conditioning the lapping plate by embedding diamonds from a diamond lapping slurry into the lapping surface;
   (d) mounting the workpiece to be lapped onto the lapping plate; and
   (e) lapping the workpiece to remove material therefrom by rotating the lapping plate surface against the workpiece while periodically applying a diamond lapping slurry onto the lapping plate and placing a conditioning device on the lapping plate to continuously embed diamonds from the lapping slurry into the lapping surface.

2. The method of claim 1 wherein the lapping plate is made of a copper composite material.

3. The method of claim 1 wherein the surface of the lapping plate is concave at a center of the lapping plate with respect to an outer edge of the lapping plate.

4. The method of claim 1 wherein the step of conditioning the lapping plate to furnish the lapping plate surface with ridges includes the step of using a diamond embedded conditioning ring placed on the lapping plate to provide a rough lapping surface finish.

5. The method of claim 1 wherein the step of conditioning the lapping plate by embedding diamonds from a diamond slurry into the lapping plate includes the step of using a ceramic conditioning ring placed on the lapping plate ahead of a diamond slurry spray to embed the diamonds from the slurry into the lapping surface.

6. The method of claim 1 wherein the workpiece is mounted onto the lapping plate using a vacuum hold down mounting fixture having a thickness monitoring gauge, and including the additional step of monitoring an amount of material removed from the workpiece using the thickness gauge during the step of lapping the workpiece.

7. The method of claim 1 wherein the conditioning steps (b) and (c) are repeated periodically after the step of lapping the workpiece causes the ridges on the roughened polishing surface of the lapping plate to be worn down.

8. The method of claim 1 wherein the workpiece includes a substrate upon which a layer including photoresist and vertically dimensional metal microstructures which are more high than wide has been applied.

9. The method of claim 1 wherein the workpiece includes a pre-formed photoresist sheet which has been exposed in a pattern to radiation to render portions of the photoresist sheet removable using a developer.

10. The method of claim 1 including the additional steps of removing the workpiece from the lapping plate, and finish polishing the workpiece using a polishing machine having a hard polishing plate covered by a polishing cloth which is saturated with a diamond slurry.

11. The method of claim 1 wherein the diamond lapping slurry includes diamond particles having a size between approximately 0.5 and 30 micrometers in diameter.

12. A method for lapping a workpiece including a microstructure layer formed of photoresist or metal, comprising the steps of:

(a) furnishing a lapping machine with a lapping plate having a lapping surface made of a soft metal;
   (b) conditioning the lapping plate to furnish the lapping plate surface with a rough ridged surface;
   (c) conditioning the lapping plate by embedding diamonds from a diamond lapping slurry into the lapping surface;

(d) mounting the workpiece on a mounting plate made of a material selected from the group of materials consisting of steel and glass, mounting glass support pieces on the mounting plate around the workpiece, and placing weights on the mounting plate to provide contact pressure between the workpiece and the glass support pieces and the lapping plate surface; and (e) lapping the workpiece to remove material therefrom by rotating the lapping plate surface against the workpiece while periodically applying a diamond lapping slurry onto the lapping plate and continuously embedding diamonds from the lapping slurry into the lapping surface.

13. The method of claim 12 comprising the additional steps of periodically measuring a thickness of the glass support pieces during the lapping step and adjusting positions of the weights on the mounting plate to level the thicknesses of the glass support pieces.

14. A method for lapping a workpiece including a microstructure layer formed of photoresist or metal, comprising the steps of:

(a) furnishing a lapping machine with a lapping plate having a lapping surface made of a soft metal;

(b) conditioning the lapping plate using a diamond embedded conditioning ring placed on the lapping surface to furnish the lapping plate surface with a rough ridged surface;

(c) conditioning the lapping plate by spraying a diamond lapping slurry onto the lapping plate surface and embedding diamonds from the lapping slurry into the surface using a ceramic conditioning ring placed on the lapping plate ahead of the diamond slurry spray;

(d) mounting a workpiece to be lapped onto the lapping plate; and (e) lapping the workpiece to remove material therefrom by rotating the lapping plate surface against the workpiece while periodically spraying a diamond lapping slurry onto the lapping plate and continuously embedding diamonds from the lapping slurry into the lapping surface using the ceramic conditioning ring.

15. The method of claim 14 wherein the lapping plate is made of a copper composite material.

16. The method of claim 14 wherein the lapping surface of the lapping plate is concave at a center of the lapping plate with respect to an outer edge of the lapping plate.

17. The method of claim 14 wherein the workpiece is mounted onto the lapping plate using a vacuum hold down mounting fixture having a thickness monitoring gauge, and including the additional step of monitoring an amount of material removed from the workpiece using the thickness monitoring gauge during the step of lapping the workpiece.

18. The method of claim 14 wherein the workpiece is mounted onto the lapping plate by mounting the workpiece on a mounting plate made of a material selected from the group of materials consisting of steel and glass, mounting glass support pieces on the mounting plate around the workpiece, and by placing weights on the mounting plate to provide contact pressure between the workpiece and the glass support pieces and the lapping plate surface.

19. The method of claim 18 comprising the additional steps of periodically measuring a thickness of the glass support pieces during the lapping step and adjusting positions of the weights on the mounting plate to level the thicknesses of the glass support pieces.

20. The method of claim 14 wherein the conditioning steps (b) and (c) are repeated periodically after the step of lapping the workpiece causes the ridges on the roughened surface of the lapping plate to be worn down.

21. The method of claim 14 wherein the workpiece includes a substrate upon which a layer including photoresist and metal microstructures has been applied.

22. The method of claim 14 wherein the workpiece includes a pre-formed photoresist sheet which has been exposed in a pattern to radiation to render portions of the photoresist sheet removable using a developer.

23. The method of claim 14 including the additional steps of removing the workpiece from the lapping plate, and finish polishing the workpiece using a polishing machine having a hard polishing plate covered by a polishing cloth which is saturated with a diamond slurry.

24. The method of claim 14 wherein the diamond lapping slurry includes diamond particles having a size between approximately 0.5 and 30 micrometers in diameter.

25. A lapping apparatus for lapping a workpiece including a microstructure layer formed of photoresist or metal, comprising:

(a) a lapping machine with a lapping plate having a lapping surface made of a soft metal and wherein the lapping plate is conditioned such that the lapping plate surface has a rough ridged surface and such that diamonds from a diamond lapping slurry are embedded into the rough ridged surface;

(b) mounting means for mounting the workpiece to be lapped onto the lapping plate for lapping the workpiece;

(c) means for periodically applying a diamond lapping slurry onto a location on the lapping plate while lapping the workpiece to remove material therefrom; and (d) conditioning means for continuously embedding diamonds from the lapping slurry into the lapping surface while lapping the workpiece, the conditioning means placed on the lapping plate between the location on the lapping plate where the diamond lapping slurry is applied and the workpiece.

26. The lapping apparatus of claim 25 wherein the lapping plate is made of a copper composite material.

27. The lapping apparatus of claim 25 wherein the surface of the lapping plate is concave at a center of the lapping plate with respect to an outer edge of the lapping plate.

28. The lapping apparatus of claim 25 wherein the mounting means includes a vacuum hold down mounting fixture having a thickness monitoring gauge for monitoring an amount of material removed from the workpiece during lapping of the workpiece.

29. The lapping apparatus of claim 25 wherein the conditioning means for continuously embedding diamonds from the lapping slurry into the lapping plate surface includes a ceramic conditioning ring placed on the lapping plate between a lapping slurry spray and the workpiece being lapped.

30. A lapping apparatus for lapping a workpiece including a microstructure layer formed of photoresist or metal, comprising:

(a) a lapping machine with a lapping plate having a lapping surface made of a soft metal and wherein the lapping plate is conditioned such that the lapping plate surface has a rough ridged surface and such that diamonds from a diamond lapping slurry are embedded into the rough ridged surface;

(b) mounting means for mounting the workpiece to be lapped onto the lapping plate for lapping the workpiece including a mounting plate made of a material selected from the group of materials consisting of steel and glass upon which the workpiece is mounted along with glass support pieces of equal thickness mounted on the mounting plate around the workpiece, and weights on the mounting plate to provide contact pressure between the workpiece and the glass support pieces and the lapping plate surface;

(c) means for periodically applying a diamond lapping slurry onto the lapping plate while lapping the workpiece to remove material therefrom; and (d) means for continuously embedding diamonds from the lapping slurry into the lapping surface while lapping the workpiece.

31. A method of forming metal microstructures, comprising the steps of:

(a) applying a photoresist in a layer onto a substrate base;

(b) exposing the photoresist in a pattern to radiation to render the photoresist dissolvable in a pattern;

(c) removing the dissolvable photoresist;

(d) depositing a first layer of metal onto the substrate base into the area from which the photoresist has been removed to form a photoresist-metal layer; and (e) planarizing the photoresist-metal layer by:

(1) mounting the substrate base on a lapping machine with a lapping plate having a lapping surface made of a soft metal wherein the lapping plate is conditioned such that the lapping plate surface has a rough ridged surface and such that diamonds from a diamond lapping slurry have been embedded into the rough ridged surface, and (2) lapping the photoresist-metal layer to remove material therefrom by rotating the lapping plate surface against the photoresist-metal layer while periodically applying a diamond lapping slurry onto the lapping plate and placing a conditioning device on the lapping plate to continuously embed diamonds from the lapping slurry into the lapping surface.

32. The method of claim 31 wherein the substrate base is mounted on the lapping machine using a vacuum hold down mounting fixture having a thickness monitoring gauge, and including the additional step of monitoring an amount of material removed from the photoresist-metal layer using the thickness monitoring gauge during the step of lapping the photoresist-metal layer.

33. The method of claim 31 comprising the additional step of periodically reconditioning the lapping plate to have a rough ridged surface with diamonds from a lapping slurry embedded therein after the step of lapping the photoresist-metal layer causes ridges on the roughened surface of the lapping plate to be worn down.

34. The method of claim 31 including the additional steps of removing the substrate base from the lapping machine and finish polishing the photoresist-metal layer using a polishing machine having a hard polishing plate covered by a polishing cloth which is saturated with a diamond slurry.

35. The method of claim 31 wherein the diamond lapping slurry includes diamond particles having a size between approximately 0.5 and 30 micrometers in diameter.

36. The method of claim 31 comprising additionally the steps of:

(a) applying a photoresist in a second layer onto the lapped photoresist-metal layer;

(b) exposing the second layer of photoresist in a pattern to radiation to render the photoresist dissolvable in a pattern;

(c) removing the dissolvable photoresist from the second layer of photoresist; and (d) depositing a second layer of metal onto the first layer of metal and into the area from which the photoresist from the second layer of photoresist has been removed to form a multi-level metal structure.

37. A method of forming metal microstructures, comprising the steps of:

(a) applying a photoresist in a layer onto a substrate base;

(b) exposing the photoresist in a pattern to radiation to render the photoresist dissolvable in a pattern;

(c) removing the dissolvable photoresist;

(d) depositing a first layer of metal onto the substrate base into the area from which the photoresist has been removed to form a photoresist-metal layer; and (e) planarizing the photoresist-metal layer by:

(1) mounting the substrate base on a lapping machine by mounting the substrate base on a mounting plate, mounting glass support pieces on the mounting plate around the substrate base, and by placing weights on the mounting plate to provide contact pressure between the photoresist-metal layer and the glass support pieces and a lapping plate surface, wherein the lapping plate surface is made of a soft metal and wherein the lapping plate is conditioned such that the lapping plate surface has a rough ridged surface and such that diamonds from a diamond lapping slurry have been embedded into the rough ridged surface, and (2) lapping the photoresist-metal layer to remove material therefrom by rotating the lapping plate surface against the photoresist-metal layer while periodically applying a diamond lapping slurry onto the lapping plate and continuously embedding diamonds from the lapping slurry into the lapping surface.

38. A method of forming microstructures, comprising the steps of:

(a) providing a first preformed sheet of photoresist material which can be exposed to radiation to affect its susceptibility to a developer;

(b) exposing the photoresist sheet in a pattern to radiation which will change its susceptibility to a developer; and (c) removing the material of the photoresist sheet to reduce the thickness of the sheet to a desired thickness by:

(1) mounting the photoresist sheet on a lapping machine with a lapping plate having a lapping surface made of a soft metal wherein the lapping plate is conditioned such that the lapping plate surface has a rough ridged surface and such that diamonds from a diamond lapping slurry have been embedded into the rough ridged surface, and (2) lapping the photoresist sheet to remove material therefrom by rotating the lapping plate surface against the photoresist sheet while periodically applying a diamond lapping slurry onto the lapping plate and placing a conditioning device on the lapping plate to continuously embed diamonds from the lapping slurry into the lapping surface.

39. The method of claim 38 wherein the photoresist sheet is mounted on the lapping machine using a vacuum hold down mounting fixture having a thickness monitoring gauge, and including the additional step of monitoring an amount of material removed from the photoresist sheet using the thickness monitoring gauge during the step of lapping the photoresist sheet.

40. The method of claim 38 comprising additionally the steps of:

(a) providing a second preformed sheet of photoresist material which may be exposed to radiation to affect its susceptibility to a developer;

(b) exposing the second photoresist sheet in a pattern to radiation to change its susceptibility to a developer; and (c) adhering the second photoresist sheet to the lapped surface of the first photoresist sheet.

* * * * *